(12) United States Patent
Chen et al.

(10) Patent No.: US 12,217,999 B2
(45) Date of Patent: Feb. 4, 2025

(54) TRENCH ISOLATION PROCESS

(71) Applicant: Taiwan Semiconductor Manufacturing Company, Ltd., Hsinchu (TW)

(72) Inventors: Chung-Lei Chen, Hsinchu (TW); Cheng-Hsin Chen, Toufen (TW); Chung Chieh Ting, Taipei (TW); Che-Yi Lin, Hsinchu (TW); Clark Lee, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 53 days.

(21) Appl. No.: 17/818,497

(22) Filed: Aug. 9, 2022

(65) Prior Publication Data

US 2022/0392799 A1 Dec. 8, 2022

Related U.S. Application Data

(63) Continuation of application No. 16/949,214, filed on Oct. 20, 2020, now Pat. No. 11,443,976.

(51) Int. Cl.
*H01L 21/762* (2006.01)
*H01L 21/02* (2006.01)
*H01L 21/306* (2006.01)
*H01L 21/311* (2006.01)

(52) U.S. Cl.
CPC .. *H01L 21/76224* (2013.01); *H01L 21/02123* (2013.01); *H01L 21/30625* (2013.01); *H01L 21/31133* (2013.01)

(58) Field of Classification Search
CPC ......... H01L 21/76224; H01L 21/76229; H01L 21/76232; H01L 21/823481; H01L 21/823878
See application file for complete search history.

(56) References Cited

U.S. PATENT DOCUMENTS

| | | | |
|---|---|---|---|
| 8,501,565 B2 | 8/2013 | Chin et al. | |
| 9,525,077 B1 * | 12/2016 | Bi | ........................ H01L 29/0821 |
| 10,580,857 B2 * | 3/2020 | Wang | ................ H01L 21/76232 |
| 11,443,976 B2 * | 9/2022 | Chen | ................. H01L 21/02123 |
| 2002/0014676 A1 * | 2/2002 | Marty | ............... H01L 21/02255 |
| | | | 257/E21.549 |
| 2002/0081809 A1 | 6/2002 | Pinto et al. | |
| 2006/0267134 A1 | 11/2006 | Tilke et al. | |
| 2010/0203703 A1 | 8/2010 | Tilke et al. | |
| 2015/0001669 A1 | 1/2015 | Chou et al. | |

(Continued)

FOREIGN PATENT DOCUMENTS

TW 200711123 A 3/2007
TW 201232699 A 8/2012

*Primary Examiner* — Kretelia Graham
*Assistant Examiner* — William Henry Anderson
(74) *Attorney, Agent, or Firm* — Harrity & Harrity, LLP

(57) ABSTRACT

One or more semiconductor processing tools may form a deep trench within a silicon wafer. The one or more semiconductor processing tools may deposit a first insulating material within the deep trench. The one or more semiconductor processing tools may form, after forming the deep trench with the silicon wafer, a shallow trench above the deep trench. The one or more semiconductor processing tools may deposit a second insulating material within the shallow trench.

20 Claims, 14 Drawing Sheets

(56) References Cited

U.S. PATENT DOCUMENTS

| | | | |
|---|---|---|---|
| 2015/0014807 A1* | 1/2015 | Chuang | H01L 29/0649 |
| | | | 438/430 |
| 2015/0295005 A1* | 10/2015 | Tseng | H01L 29/0649 |
| | | | 257/446 |
| 2017/0076976 A1* | 3/2017 | Yeh | H01L 21/76232 |
| 2017/0207270 A1 | 7/2017 | Chen et al. | |
| 2018/0323187 A1* | 11/2018 | Moen | H01L 29/7375 |
| 2019/0035828 A1 | 1/2019 | Han | |
| 2019/0259651 A1 | 8/2019 | Lillibridge | |
| 2020/0203478 A1* | 6/2020 | Shank | H01L 21/76237 |
| 2021/0193658 A1* | 6/2021 | Paleari | H01L 23/535 |
| 2022/0122880 A1 | 4/2022 | Chen et al. | |

\* cited by examiner

200

202 - Deposit an oxide layer, a nitride layer, and a hard mask on a silicon wafer 204 - Deposit a photoresist layer outside of a deep trench region 206 – Etch the oxide layer, the nitride layer, and the hard mask within the deep trench region 208 – Deep etch into the silicon wafer and remove the photoresist layer

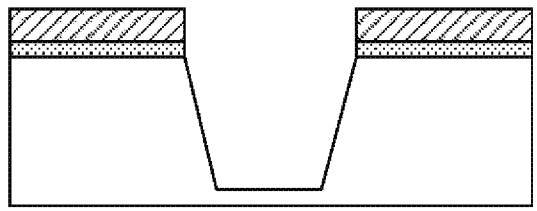
FIG. 2E — 210 – Remove the hard mask
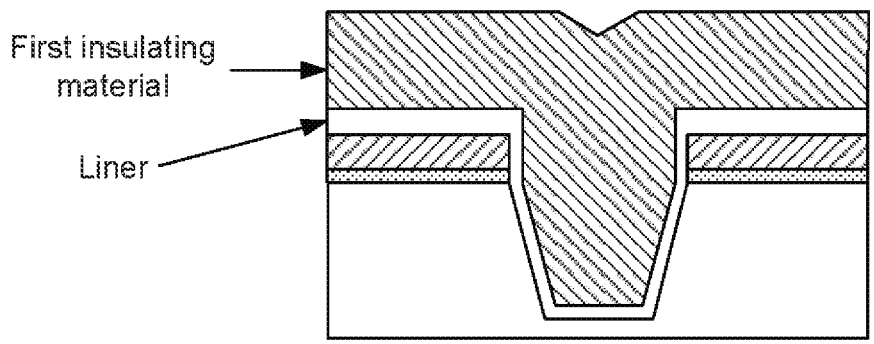
FIG. 2F(i) — 212(i) – Deposit a liner and a first insulating material within the deep trench
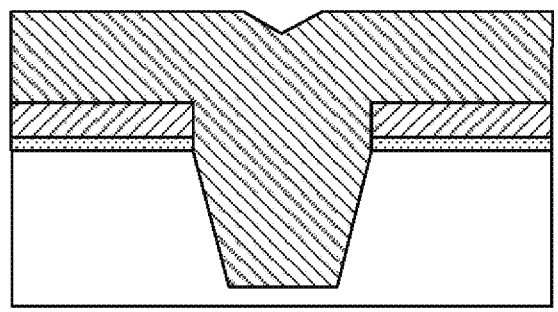
FIG. 2F(ii) — 212(ii) – Deposit a first insulating material within the deep trench 214 – Etch the first insulating material
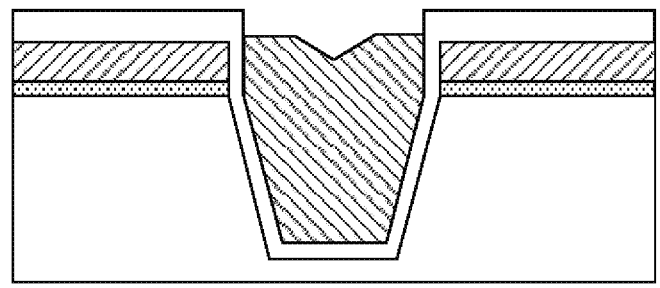
FIG. 2G
216(i) – Remove the liner
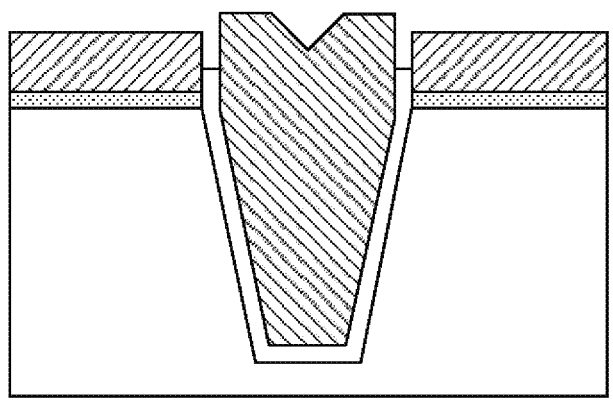
FIG. 2H(i)
216(ii) – Remove the liner and apply anneal to the silicon wafer
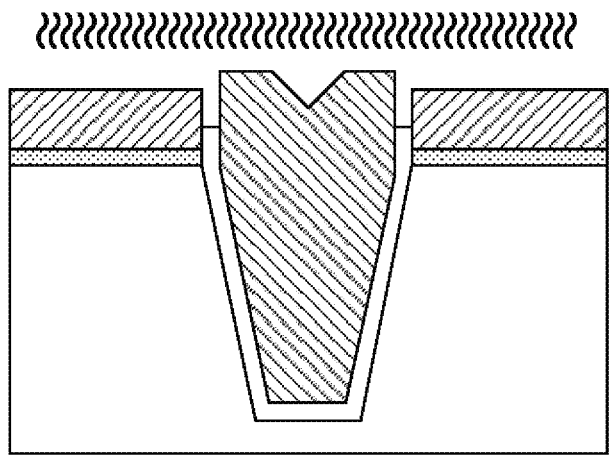
FIG. 2H(ii)

200

222 – Etch to form a shallow trench and remove the photoresist layer

224 – Deposit a second insulating material within the shallow trench

200

226 – Perform a chemical-mechanical polishing process

228 – Remove the nitride layer and the oxide layer

TRENCH ISOLATION PROCESS

RELATED APPLICATION

This application is a continuation of U.S. patent application Ser. No. 16/949,214, filed Oct. 20, 2020, which is incorporated herein by reference in its entirety.

BACKGROUND

Trench isolation may be used in a complementary metal-oxide-semiconductor (CMOS) process to manufacture, for example, a metal-oxide-semiconductor field-effect transistor (MOSFET). Trench isolation processes may include a shallow trench isolation (STI) process, a deep trench isolation (DTI) process, and/or the like. Trench isolation may be used to isolate an active area of a semiconductor chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
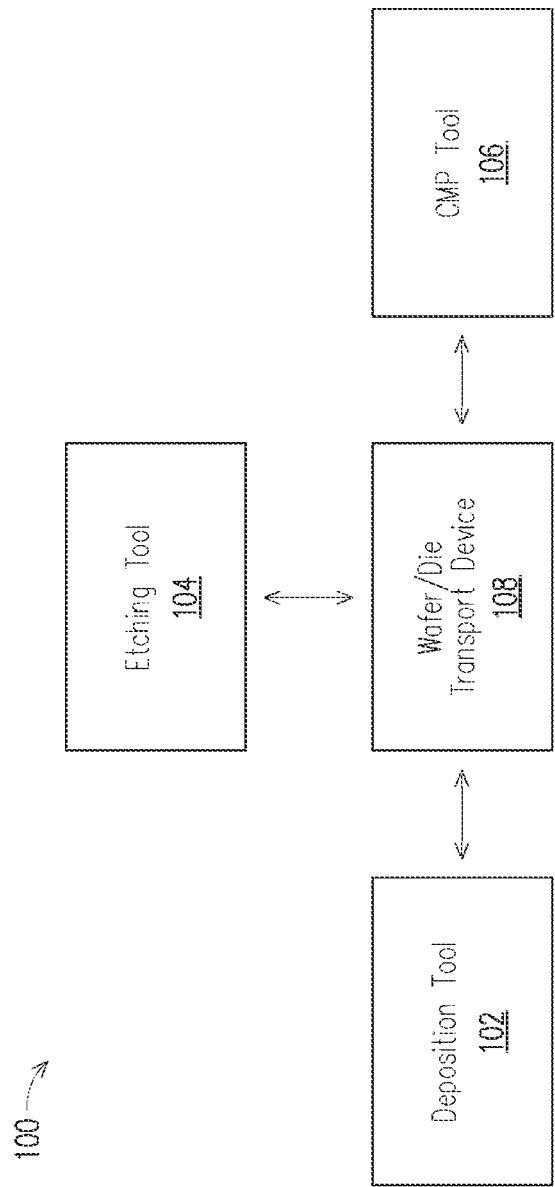
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Trench isolation may be used to isolate an active area of a semiconductor chip, such as a metal-oxide-semiconductor field-effect transistor (MOSFET). In some CMOS processes, one or more semiconductor processing tools may separately perform STI processes and DTI processes within a process flow. In these CMOS processes, the one or more semiconductor processing tools may form an active area of the semiconductor chip, perform STI processes, perform a chemical-mechanical polishing (CMP) process, and then perform DTI processes without polishing (e.g., planarizing) any formed DTIs. DTI without planarization may risk defects and unreliability; however, performing an additional CMP processes after performing the DTI processes may increase manufacturing time, complexity, and cost.

In some implementations described herein, a trench isolation process may include forming a deep trench before forming a shallow trench. In some implementations, the trench isolation process may include polishing the deep trench and the shallow trench in a same CMP process. Additionally, or alternatively, the trench isolation process may include forming the deep trench and the shallow trench before depositing material for semiconductor operation within an active area of a silicon wafer. In this way, one or more semiconductor processing tools may apply anneal or otherwise repair damage to the silicon wafer (e.g., caused during the trench isolation process) before forming the active area of the silicon wafer.

Based on performing DTI before performing STI (e.g., forming the deep trench before the shallow trench), an upper surface of the deep trench may be sealed by an oxidation layer (e.g., deposited as part of performing STI) that fills the shallow trench. The oxidation layer may protect against defects on the upper surface of the deep trench. Additionally, based on performing a single CMP process for both the deep trench and the shallow trench, manufacturing costs may be reduced by eliminating a step of a manufacturing process. Further, based on forming the deep trench and the shallow trench before forming an active area of the silicon wafer, one or more semiconductor processing tools may apply anneal to repair damage that is incurred during a trench isolation process. Still further, cycle time for manufacturing semiconductor chips using silicon wafers may be improved based on preparing the silicon wafers with the DTI before starting a process of manufacturing the semiconductor chips.

FIG. 1 is a diagram of an example environment 100 in which systems and/or methods described herein may be implemented. As shown in FIG. 1, environment 100 may include a plurality of semiconductor processing tools 102-106 and a wafer/die transport device 108. The plurality of semiconductor processing tools 102-106 may include a deposition tool 102, a an etching tool 104, a chemical-mechanical polishing (CMP) tool 106, and/or other the like. The semiconductor processing tools included in example environment 100 may be included in a semiconductor clean room, a semiconductor foundry, a semiconductor processing and/or manufacturing facility, and/or the like.

Deposition tool 102 is a semiconductor processing tool that includes a semiconductor processing chamber and one or more devices capable of depositing various types of materials onto a semiconductor device. For example, deposition tool 102 may include a chemical vapor deposition device (e.g., an electrostatic spray device, an epitaxy device, and/or another type of chemical vapor deposition device), a physical vapor deposition device (e.g., a sputtering device and/or another type of physical vapor deposition device), an atomic layer deposition device, and/or the like. In some implementations, deposition tool 102 may deposit a metal layer onto a source region or a drain region of a semiconductor device, may deposit a contact material to form a contact (e.g., a self-aligned contact) of a semiconductor device, and/or the like as described herein.

Etching tool 104 is a semiconductor processing tool that includes one or more devices capable of etching (e.g., removing) material from a surface of a wafer or a semiconductor device. For example, etching tool 104 may include a wet etching device, a dry etching device, a laser etching device, a chemical etching device, a plasma etching device, a reactive ion etching device, a sputter etching device, a vapor phase etching device, and/or the like. In some implementations, etching tool 104 may remove a layer from a semiconductor device as described herein.

CMP tool 106 is a semiconductor processing tool that includes one or more device capable of polishing or planarizing various layers of a wafer or semiconductor device. In some implementations, CMP tool 106 may polish or planarize a layer of deposited or plated material.

Wafer/die transport device 108 includes a mobile robot, a robot arm, a tram or rail car, and/or another type of device that are used to transport wafers and/or dies between semiconductor processing tools 102-106 and/or to and from other locations such as a wafer rack, a storage room, and/or the like. In some implementations, wafer/die transport device 108 may be a programmed device to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2A:
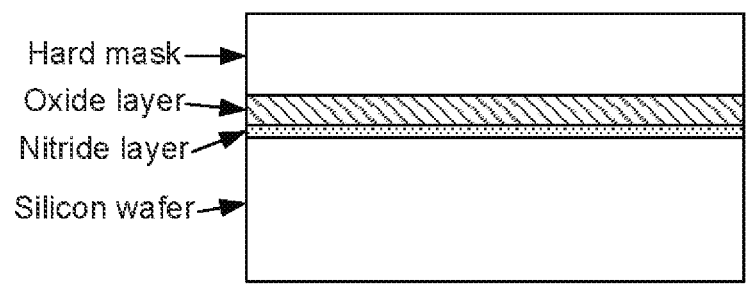
FIGS. 2A-2N are diagrams of one or more example implementations described herein.
Figure 2B:
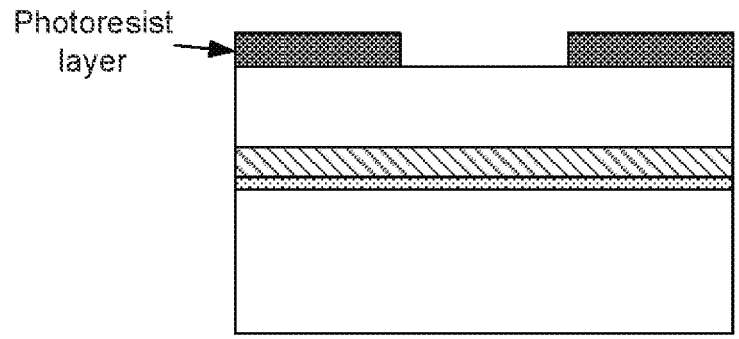
Figure 2C:
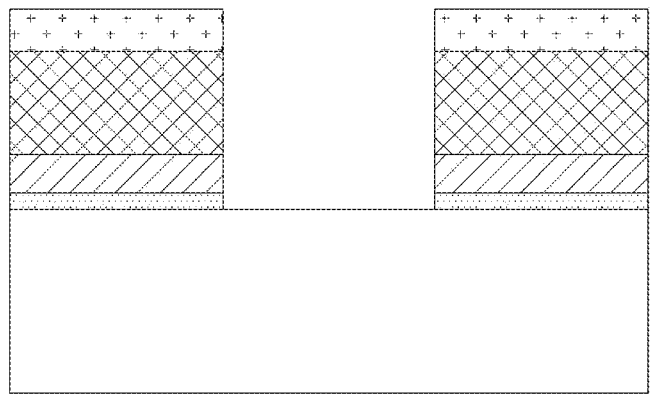
Figure 2D:
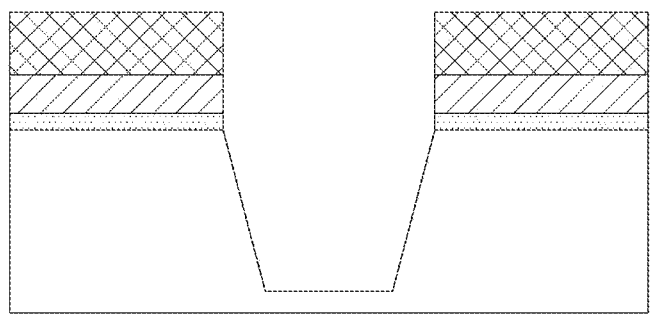
Figure 2I:
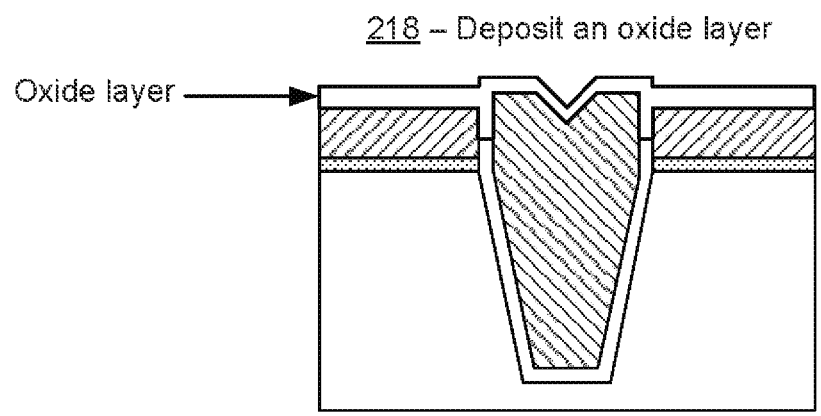
Figure 2J:
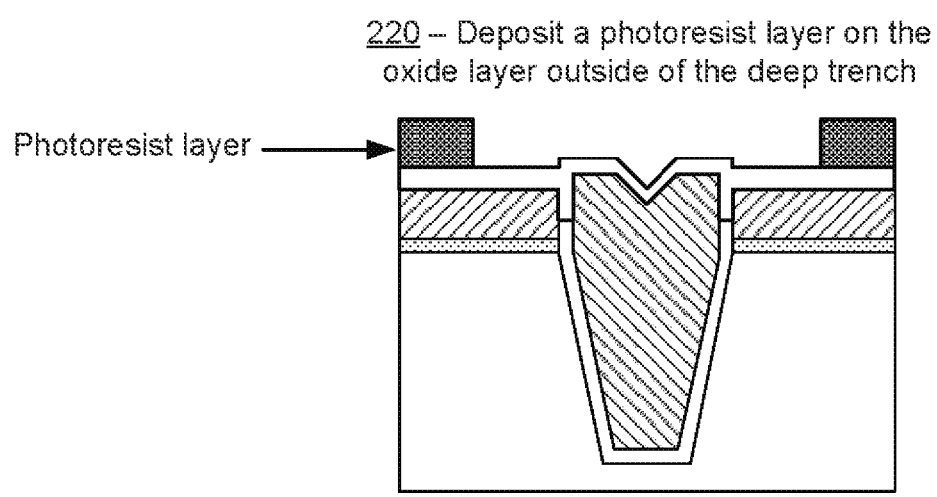
Figure 2K:
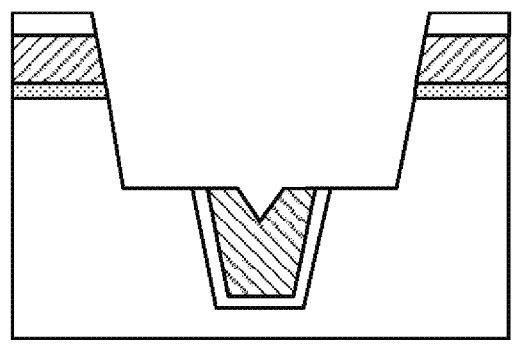
Figure 2L:
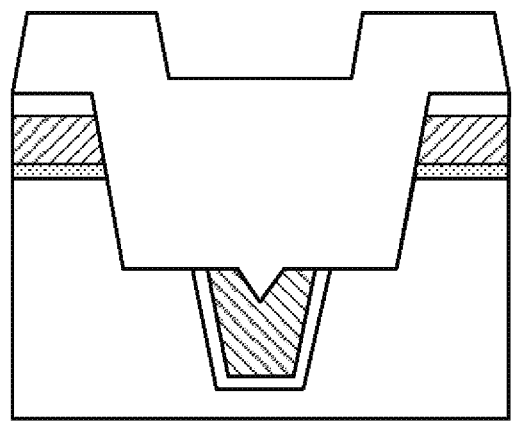
Figure 2M:
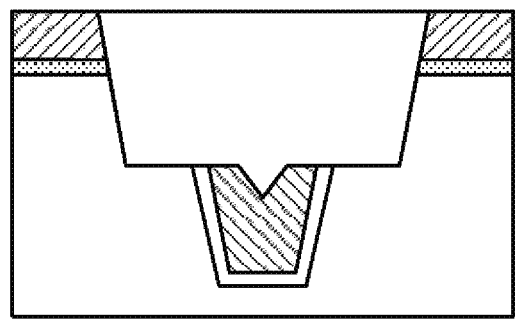
Figure 2N:
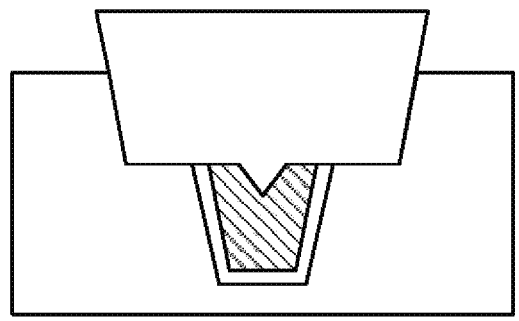

FIGS. 2A-2N are diagrams of one or more example implementations 200 described herein. Example implementation(s) 200 may include one or more example implementations of a trench isolation process. The trench isolation process may include forming a deep trench before forming a shallow trench. In some implementations, the trench isolation process may include polishing the deep trench and the shallow trench in a same trench CMP process. Additionally, or alternatively, the trench isolation process may include forming the deep trench and the shallow trench before depositing material for semiconductor operation within an active area of a silicon wafer. In this way, one or more semiconductor processing tools may apply anneal or otherwise repair damage to the silicon wafer (e.g., caused during the trench isolation process) before forming the active area of the silicon wafer. A trench isolation process may include one or more operations described with respect to FIGS. 2A-2N.

As shown in FIG. 2A, and by reference number 202, a deposition tool (e.g., deposition tool 102) may deposit an oxide layer, a nitride layer, and a hard mask on a silicon wafer. In some implementations, the nitride layer may include silicon nitride, silicon mononitride, and/or the like. In some implementations, the deposition tool may deposit a silicon dioxide-silicon nitride-silicon dioxide (ONO) layer that includes the oxide layer and the nitride layer. In some implementations, the hard mask may include tetraethyl orthosilicate (TEOS), plasma enhanced tetraethyl orthosilicate (PETEOS), and/or the like. The hard mask may have a thickness of approximately 16,000 angstroms.

As shown in FIG. 2B, and by reference number 204, the deposition tool (e.g., deposition tool 102) may deposit a photoresist layer outside of a deep trench region. For example, the deposition tool may deposit the photoresist layer with a gap to define the deep trench region of the silicon wafer (e.g., a region of the silicon wafer into which the deep trench is to be formed).

As shown in FIG. 2C, and by reference number 206, an etching tool (e.g., etching tool 104) may etch the oxide layer, the nitride layer, and the hard mask within the deep trench region. In some implementations, the etching tool may remove the oxide layer, the nitride layer, and the hard mask using laser etching.

As shown in FIG. 2D, and by reference number 208, the etching tool (e.g., etching tool 104) may deep etch into the silicon wafer and remove the photoresist layer from around the deep trench region. In some implementations, the etching tool may deep etch into the silicon wafer to form a deep trench using wet etching, dry etching, and/or the like. In some implementations, the etching tool may remove the photoresist layer and may deep etch into the silicon wafer using a single etching process (e.g., chemical etching). In some implementations, the etching tool may remove a portion of the hard mask during the single etching process.

As shown in FIG. 2F(*i*), and by reference number 212(*i*), the deposition tool (e.g., deposition tool 102) may deposit a liner and a first insulating material within the deep trench. As shown by FIG. 2F(*ii*), and by reference number 212(*ii*), the deposition tool (e.g., deposition tool 102) may deposit a first insulating material within the deep trench. For example, the deposition tool may first deposit a liner having a thickness, for example, of approximately 400 angstroms. In some implementations, the liner may include TEOS. In some implementations, the first insulating material may include polysilicon. The first insulating material may be deposited to fill the deep trench and to cover an upper surface of the liner.

As shown in FIG. 2F(*i*) and/or 2F(*ii*), and by reference number 212(*i*) and/or 212(*ii*), the deposition tool (e.g., deposition tool 102) may deposit a liner and/or a first insulating material within the deep trench. For example, the deposition tool may first deposit a liner having a thickness, for example, of approximately 400 angstroms. In some implementations, the liner may include TEOS. In some implementations, the first insulating material may include polysilicon. The first insulating material may be deposited to fill the deep trench and to cover an upper surface of the liner.

As shown in FIG. 2H(*i*), and by reference number 216(*i*), the etching tool (e.g., etching tool 104) may remove the liner. As shown in FIG. 2H(*ii*), and by reference number 216(*ii*), the deposition tool (e.g., deposition tool 102) may remove the liner and apply anneal to the silicon wafer. In some implementations, the etching tool may remove the liner using wet etching. For example, the etching tool may apply oxide (e.g., using chemical vapor deposition) to remove, for example, approximately 1,000 angstroms of material. The etching tool may remove a portion of the liner so that an upper surface of the nitride layer is exposed. In some implementations, the deposition tool may apply the anneal to the silicon wafer to repair damage to the silicon wafer (e.g., incurred during the trenching process).

As shown in FIG. 2H(*i*) and/or FIG. 2H(*ii*), and by reference number 216(*i*) and/or 216(*ii*), the etching tool (e.g., etching tool 104) may remove the liner and/or the deposition tool (e.g., deposition tool 102) may apply anneal to the silicon wafer. In some implementations, the etching tool may remove the liner using wet etching. For example, the etching tool may apply oxide (e.g., using chemical vapor deposition) to remove, for example, approximately 1,000 angstroms of material. The etching tool may remove a portion of the liner so that an upper surface of the nitride layer is exposed. In some implementations, the deposition tool may apply the anneal to the silicon wafer to repair damage to the silicon wafer (e.g., incurred during the trenching process).

As shown in FIG. 2I, and by reference number 218, the deposition tool (e.g., deposition tool 102) may deposit an oxide layer on an upper surface of the first insulating material and/or regions outside of the deep trench. In some implementations, the deposition tool may deposit the oxide layer using arc deposition. The deposition tool may deposit the oxide layer so that the oxide layer covers an upper surface of the first insulating material and an upper surface of the nitride layer.

As shown in FIG. 2J, and by reference number 220, the deposition tool (e.g., deposition tool 102) may deposit a photoresist layer on the oxide layer outside of the deep trench. In some implementations, the deposition tool may deposit the photoresist layer with a gap to define a shallow trench region of the silicon wafer. The deposition tool may deposit the photoresist layer on an upper surface of the oxide layer outside of the deep trench.

As shown in FIG. 2K, and by reference number 222, the etching tool (e.g., etching tool 104) may etch the silicon wafer (e.g., within the gap that defines the shallow trench region of the silicon wafer) to form a shallow trench (e.g., above the deep trench) and may remove the photoresist layer from outside of the deep trench. In some implementations, the etching tool may remove a portion of the first insulating material to form the shallow trench. In some implementations, the etching tool may use dry etching (e.g., lithography printing) to form the shallow trench.

As shown in FIG. 2L, and by reference number 224, the deposition tool (e.g., deposition tool 102) may deposit a second insulating material within the shallow trench (and on an upper surface of the oxide layer that extends laterally from the shallow trench) and/or material for semiconductor device operation within an active area of the silicon wafer. In some implementations, the deposition tool may deposit the second insulating material using one or more deposition processes, such as thermal oxidation, chemical vapor deposition, and/or the like. In some implementations, deposition of the second insulating material may result in a non-planar upper surface of the second insulating material. In some implementations, the second insulating material may include an oxide layer, a polysilicon, and/or the like. In some implementations, the oxide layer may seal the first insulation layer, which may protect the first insulation layer from defects.

As shown in FIG. 2M, and by reference number 226, a CMP tool (e.g., CMP tool 106) may perform a CMP process. The CMP tool may remove a portion of the second insulation layer, the oxide layer that extends laterally from the shallow trench, and/or a portion of the nitride layer. In some implementations, a portion (e.g., a portion that is laterally displaced from the deep trench region) of an upper surface of the second insulating material may be generally planar with the nitride layer. In some implementations, the upper surface of the second insulating material may include a recess above an upper surface of the deep trench (e.g., within the deep trench region).

In some implementations, the deep trench (e.g., the first insulating material) may have a first depth (e.g., thickness) from an upper surface of the silicon wafer and the shallow trench (e.g., the second insulating material) may have a second depth (e.g., thickness) from the upper surface of the silicon wafer, with the second depth less than the first depth.

As shown in FIG. 2N, and by reference number 228, the etching tool (e.g., etching tool 104) may remove the nitride layer and the oxide layer and/or the deposition tool (e.g., deposition tool 102) may deposit material for semiconductor device operation within an active area of the silicon wafer. In some implementations, after removing the nitride layer and the oxide layer, the second insulating material may extend upward from an upper surface of the silicon wafer.

Based on forming the deep trench before the shallow trench, an upper surface of the deep trench may be sealed by an oxidation layer that fills the shallow trench. The oxidation layer may reduce defects on the upper surface of the deep trench. Additionally, based on performing a single CMP process for both the deep trench and the shallow trench, manufacturing costs may be reduced by eliminating a step of a manufacturing process. Further, based on forming the deep trench and the shallow trench before forming an active area of the silicon wafer, one or more semiconductor processing tools may apply anneal to repair damage that is incurred during a trench isolation process. Still further, cycle time for manufacturing semiconductor chips using silicon wafers may be improved based on preparing the silicon wafers with the DTI before starting a process of manufacturing the semiconductor chips.

The number and arrangement of structures, layers, and/or the like shown in FIGS. 2A-2N are provided as an example. In practice, a semiconductor device including additional structures and/or layers, fewer structures and/or layers, different structures and/or layers, or differently arranged structures and/or layers than those shown in FIGS. 2A-2N may be processed according to the techniques described above in connection with FIGS. 2A-2N.

Figure 3:
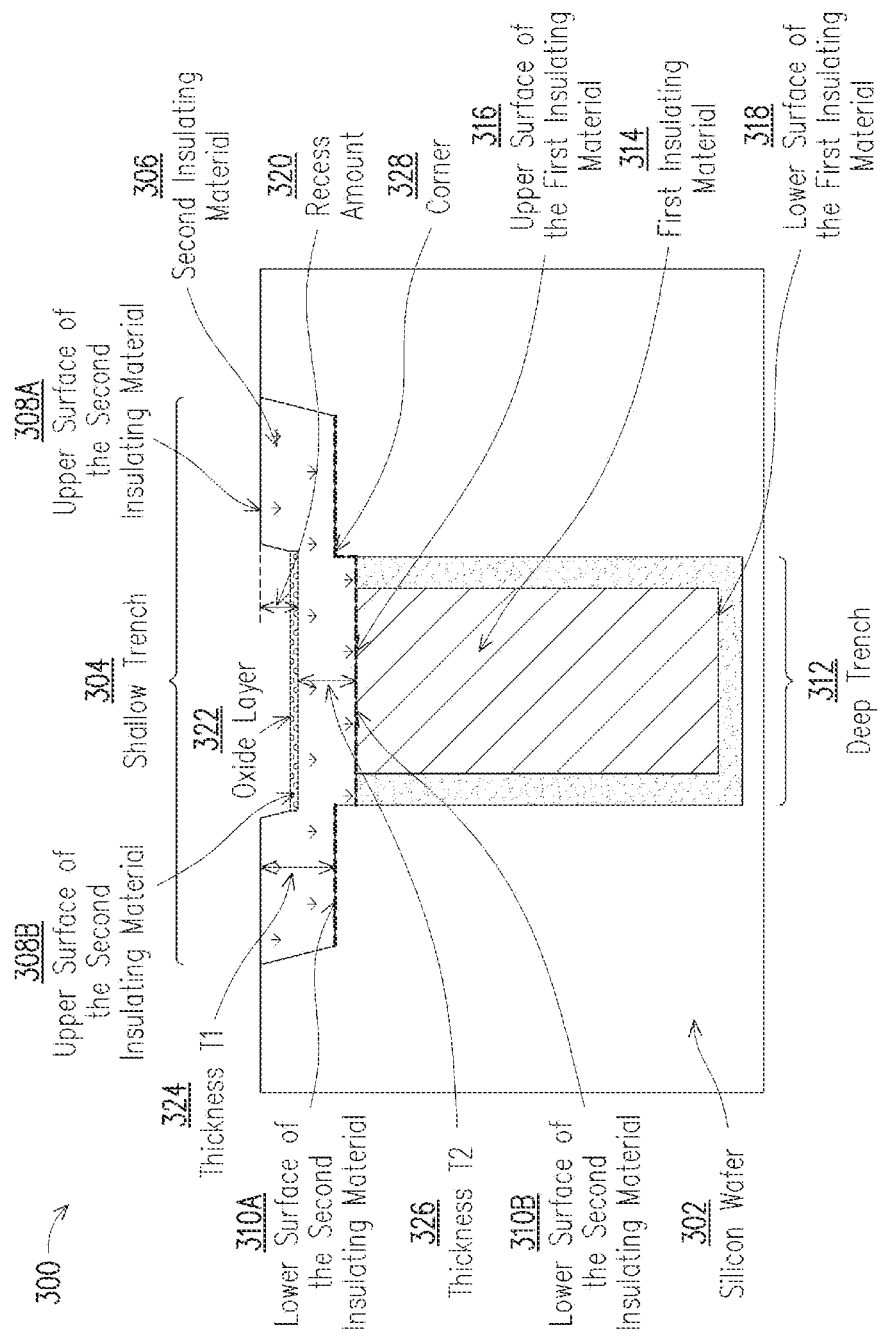
FIGS. 3 and 4 are diagrams of one or more example semiconductor devices formed based on the example techniques described in connection with FIGS. 2A-2N.

FIG. 3 is a diagram of a semiconductor device 300 formed based on the example techniques described in connection with FIGS. 2A-2N. In some implementations, the semiconductor device 300 may include a MOSFET, a high voltage chip resistor, a memory, a mixed signal sensor, an image sensor, and/or the like. As shown in FIG. 3, the semiconductor device 300 may include a silicon wafer 302, a shallow trench 304 filled with a second insulating material 306 having an upper surface 308 (e.g., including 308A and 308B) and a lower surface 310 (e.g., including 310A and 310B), and a deep trench 312 that includes (e.g., is filled with) a first insulating material 314 having an upper surface 316 and a lower surface 318.

Figure 4:
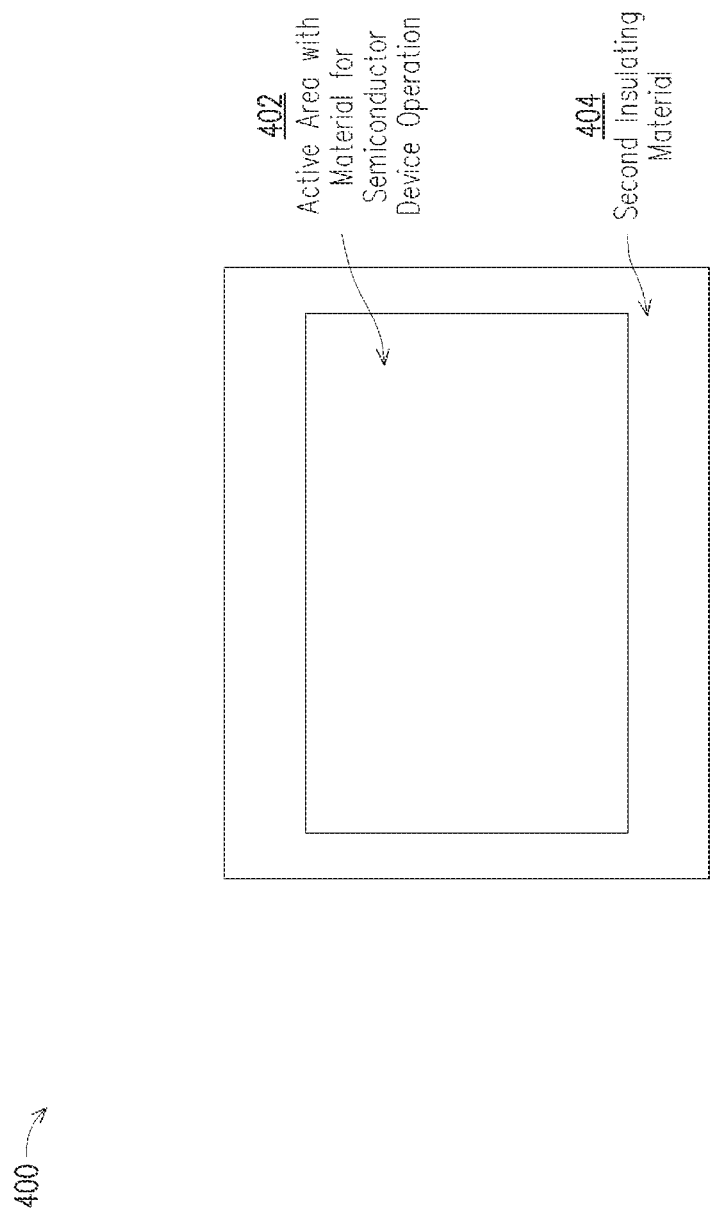

In some implementations, the semiconductor device 300 may further include an active area (e.g., as shown in FIG. 4) that is fully or partially surrounded by the shallow trench 304 and/or the deep trench 312. In some implementations, the shallow trench 304 may include a portion (e.g., defined between the upper surface 308B and the lower surface 310B of the second insulating material) that is recessed (e.g., with a recess amount 320) from the active area and/or an upper surface of the silicon wafer 302. In some implementations, the portion of the second insulating material may extend laterally from the first insulating material 314 In some implementations, the semiconductor device 300 may have an oxide layer 322 on the upper surface 308B of the second insulating material 306 (e.g., in the recessed portion).

As shown by reference number 324, the second insulating material 306 may have a thickness T1 in a portion that is laterally displaced from the deep trench 312 (e.g., e.g., a portion defined between the upper surface 308A and the lower surface 310A of the second insulating material). The thickness T1 may be in a range from approximately 1,500 angstroms to approximately 4,000 angstroms. As shown by reference number 326, the second insulating material 306 may have a thickness T2 in a portion that is above an upper surface of the deep trench 312 (e.g., defined between the upper surface 308B and the lower surface 310B of the second insulating material). The thickness T2 may correspond to an effectiveness of the deep trench 312 to isolate materials outside of the deep trench 312 from materials inside of, or surrounded by, the deep trench 312 (e.g., the active area). The thickness T2 may be in a range from approximately 2,000 angstroms to approximately 4,000 angstroms. In some implementations, the thickness T1 may be less than the thickness T2. In some implementations, the thickness T2 may be less than the thickness T1 by an amount in a range from approximately 0 angstroms to approximately 500 angstroms (e.g., by less than or equal to approximately 500 angstroms). In some implementations, the shallow trench 304 may have a corner 328 between a first portion of the shallow trench 304 that is that is laterally displaced from the deep trench 312 and a second portion of the shallow trench 304 that is within the deep trench 312. In some implementations, the corner 328 may have a corner roughness in a range from approximately 0 angstroms to approximately 200 angstroms.

In some implementations, the deep trench 312 may include a first insulating material 314. In some implementations, the deep trench 312 may also include a portion of a second insulating material 306.

As indicated above, FIG. 3 is provided as an example. Other examples may differ from what is described with regard to FIG. 3.

FIG. 4 is a diagram of a semiconductor device 400 formed based on the example techniques described in connection with FIGS. 2A-2N. In some implementations, the semiconductor device 400 may include a MOSFET, a high voltage chip resistor, a memory, a mixed signal sensor, an image sensor, and/or the like.

As shown in FIG. 4, the semiconductor device 400 may include an active area 402 with material for semiconductor device operation and a second insulating material 404. In some implementations, the active area 402 with material for semiconductor device operation may be configured to perform one or more operations of the semiconductor device 400. In some implementations, the second insulating material 404 may provide trench isolation for the semiconductor device 400. In some implementations, the second insulating material 404 may be within a shallow trench, a deep trench, a hybrid trench (e.g., including a shallow trench and a deep trench), and/or the like. As shown in FIG. 4, the second insulating material 404 may surround the active area 402 of the silicon wafer.

As indicated above, FIG. 4 is provided as an example. Other examples may differ from what is described with regard to FIG. 4.

Figure 5:
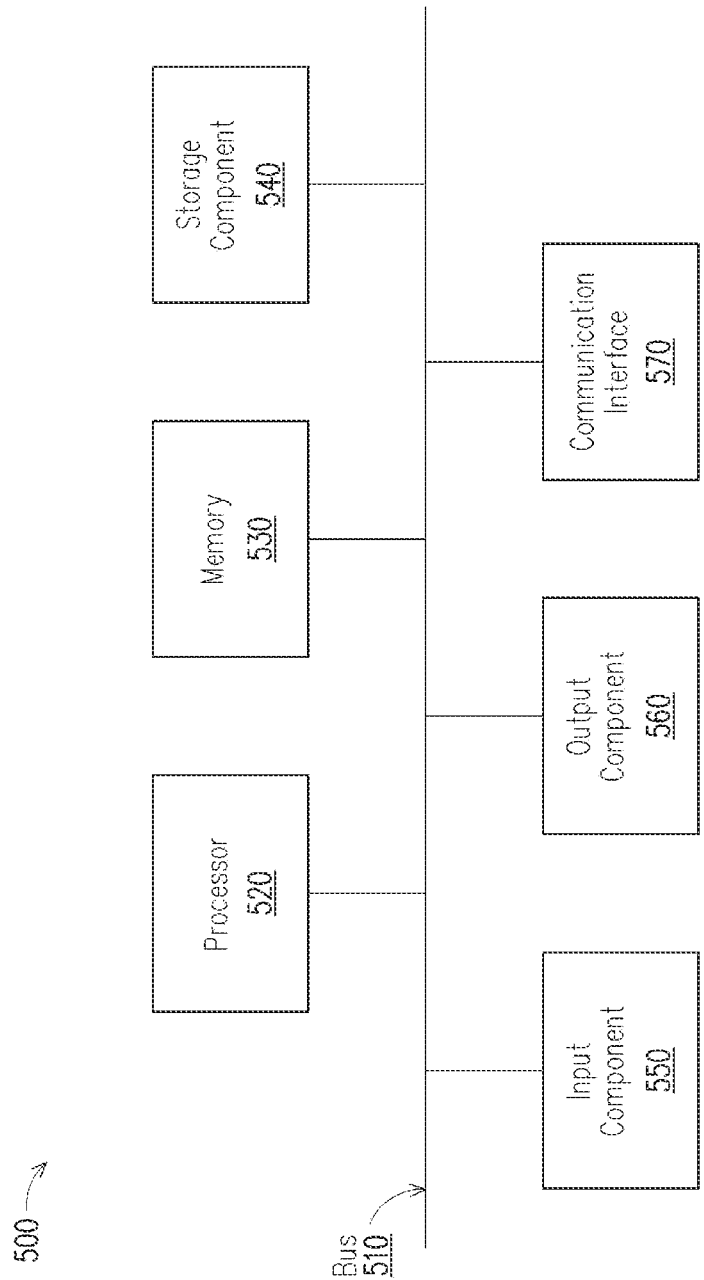
FIG. 5 is a diagram of example components of one or more devices of FIG. 1.

FIG. 5 is a diagram of example components of a device 500. In some implementations, deposition tool 102, etching tool 104, CMP tool 106, and/or wafer/die transport device 108 may include one or more devices 500 and/or one or more components of device 500. As shown in FIG. 5, device 500 may include a bus 510, a processor 520, a memory 530, a storage component 540, an input component 550, an output component 560, and a communication interface 570.

Bus 510 includes a component that enables wired and/or wireless communication among the components of device 500. Processor 520 includes a central processing unit, a graphics processing unit, a microprocessor, a controller, a microcontroller, a digital signal processor, a field-programmable gate array, an application-specific integrated circuit, and/or another type of processing component. Processor 520 is implemented in hardware, firmware, or a combination of hardware and software. In some implementations, processor 520 includes one or more processors capable of being programmed to perform a function. Memory 530 includes a random access memory, a read only memory, and/or another type of memory (e.g., a flash memory, a magnetic memory, and/or an optical memory).

Storage component 540 stores information and/or software related to the operation of device 500. For example, storage component 540 may include a hard disk drive, a magnetic disk drive, an optical disk drive, a solid state disk drive, a compact disc, a digital versatile disc, and/or another type of non-transitory computer-readable medium. Input component 550 enables device 500 to receive input, such as user input and/or sensed inputs. For example, input component 550 may include a touch screen, a keyboard, a keypad, a mouse, a button, a microphone, a switch, a sensor, a global positioning system component, an accelerometer, a gyroscope, an actuator, and/or the like. Output component 560 enables device 500 to provide output, such as via a display, a speaker, and/or one or more light-emitting diodes. Communication interface 570 enables device 500 to communicate with other devices, such as via a wired connection and/or a wireless connection. For example, communication interface 570 may include a receiver, a transmitter, a transceiver, a modem, a network interface card, an antenna, and/or the like.

Device 500 may perform one or more processes described herein. For example, a non-transitory computer-readable medium (e.g., memory 530 and/or storage component 540) may store a set of instructions (e.g., one or more instructions, code, software code, program code, and/or the like) for execution by processor 520. Processor 520 may execute the set of instructions to perform one or more processes described herein. In some implementations, execution of the set of instructions, by one or more processors 520, causes the one or more processors 520 and/or the device 500 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 5 are provided as an example. Device 500 may include additional components, fewer components, different components, or differently arranged components than those shown in FIG. 5. Additionally, or alternatively, a set of components (e.g., one or more components) of device 500 may perform one or more functions described as being performed by another set of components of device 500.

Figure 6:
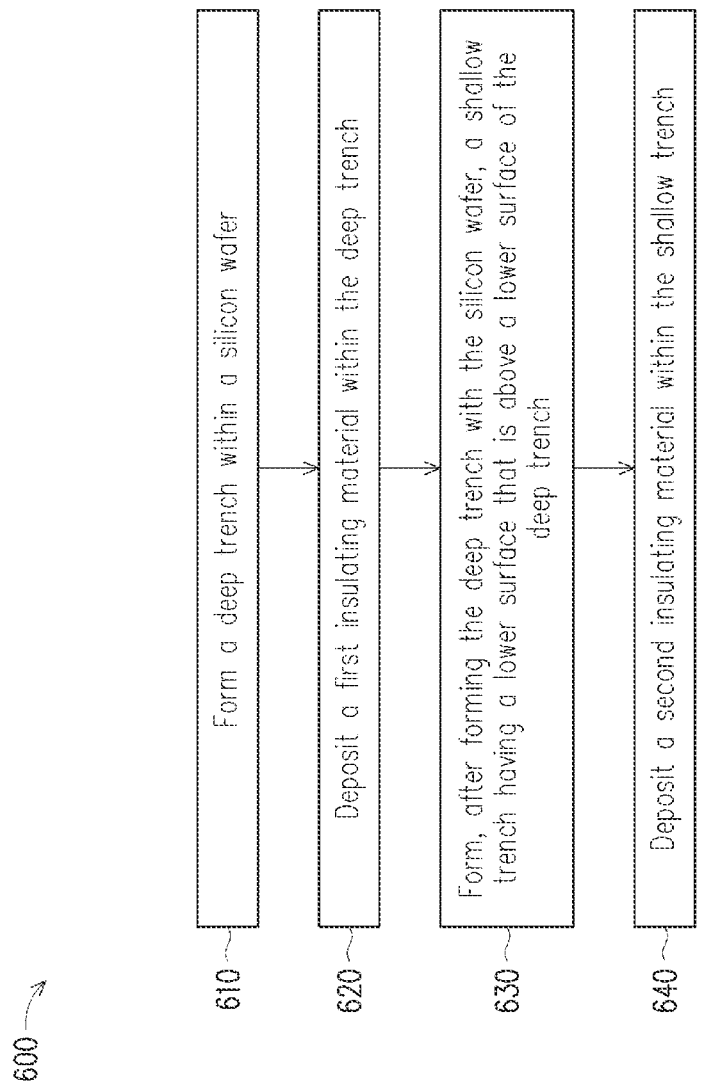
FIGS. 6-8 are flowcharts of example trench isolation processes.

FIG. 6 is a flowchart of an example process 600 associated with a trench isolation process. In some implementations, one or more process blocks of FIG. 6 may be performed by one or more semiconductor processing tools (e.g., deposition tool 102, etching tool 104, CMP tool 106, and/or wafer/die transport device 108). Additionally, or alternatively, one or more process blocks of FIG. 6 may be performed by one or more components of device 500, such as processor 520, memory 530, storage component 540, input component 550, output component 560, and/or communication interface 570.

As shown in FIG. 6, process 600 may include forming a deep trench within a silicon wafer (block 610). For example, the one or more semiconductor processing tools may form a deep trench within a silicon wafer, as described above.

As further shown in FIG. 6, process 600 may include depositing a first insulating material within the deep trench (block 620). For example, the one or more semiconductor processing tools may deposit a first insulating material within the deep trench, as described above.

As further shown in FIG. 6, process 600 may include forming, after forming the deep trench with the silicon wafer, a shallow trench above the deep trench (block 630). For example, the one or more semiconductor processing tools may form, after forming the deep trench with the silicon wafer, a shallow trench above the deep trench, as described above.

As further shown in FIG. 6, process 600 may include depositing a second insulating material within the shallow trench (block 640). For example, the one or more semiconductor processing tools may deposit a second insulating material within the shallow trench, as described above.

Process 600 may include additional implementations, such as any single implementation or any combination of implementations described below and/or in connection with one or more other processes described elsewhere herein.

In a first implementation, process 600 includes performing a single chemical-mechanical polishing process for both the deep trench and the shallow trench.

In a second implementation, alone or in combination with the first implementation, process 600 includes depositing, after depositing the second insulating material within the shallow trench, material for semiconductor device operation within an active area of the silicon wafer.

In a third implementation, alone or in combination with one or more of the first and second implementations, process 600 includes applying, before depositing material for semiconductor device operation within the active area of the silicon wafer, anneal to the silicon wafer.

In a fourth implementation, alone or in combination with one or more of the first through third implementations, the second insulating material surrounds the active area of the silicon wafer.

In a fifth implementation, alone or in combination with one or more of the first through fourth implementations, the second insulating material comprises an oxide layer.

In a sixth implementation, alone or in combination with one or more of the first through fifth implementations, one or more of the first insulating material or the second insulating material comprise polysilicon.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

Figure 7:
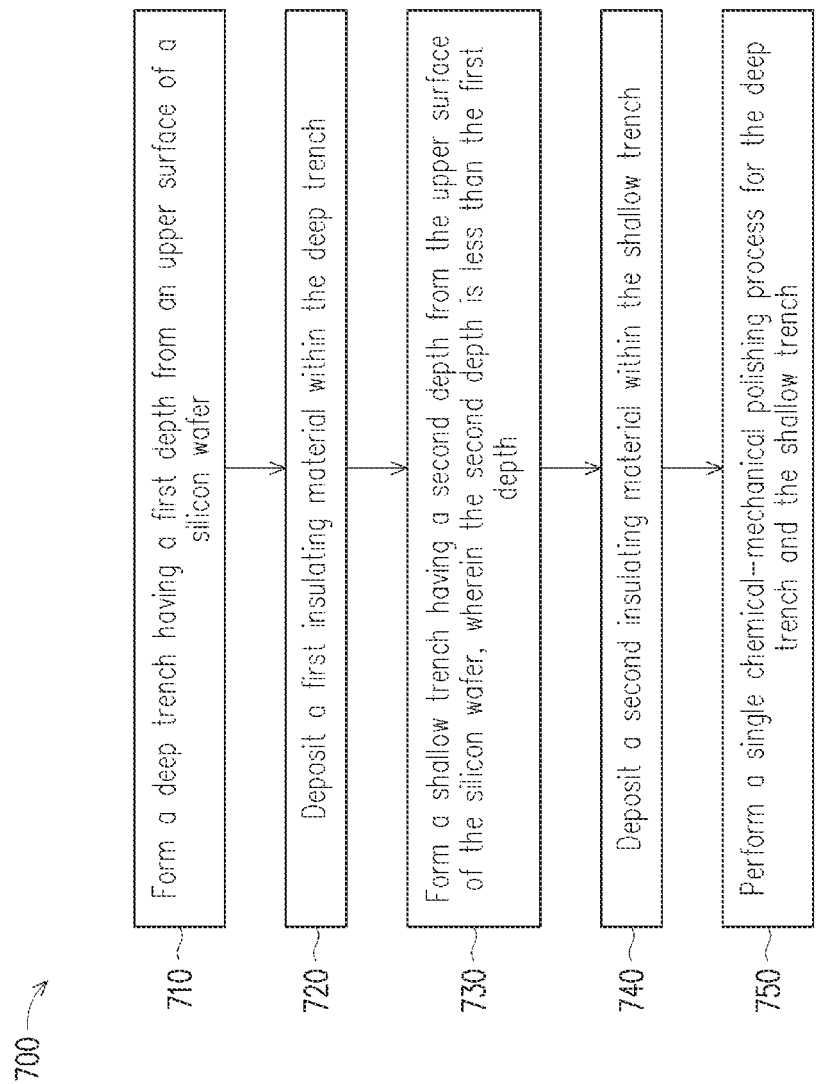

FIG. 7 is a flowchart of an example process 700 associated with a trench isolation process. In some implementations, one or more process blocks of FIG. 7 may be performed by one or more semiconductor processing tools (e.g., deposition tool 102, etching tool 104, CMP tool 106, and/or wafer/die transport device 108). Additionally, or alternatively, one or more process blocks of FIG. 7 may be performed by one or more components of device 500, such as processor 520, memory 530, storage component 540, input component 550, output component 560, and/or communication interface 570.

As shown in FIG. 7, process 700 may include forming a deep trench having a first depth from an upper surface of a silicon wafer (block 710). For example, the one or more semiconductor processing tools may form a deep trench having a first depth from an upper surface of a silicon wafer, as described above.

As further shown in FIG. 7, process 700 may include depositing a first insulating material within the deep trench (block 720). For example, the one or more semiconductor processing tools may deposit a first insulating material within the deep trench, as described above.

As further shown in FIG. 7, process 700 may include forming a shallow trench having a second depth from the upper surface of the silicon wafer, wherein the second depth is less than the first depth (block 730). For example, the one or more semiconductor processing tools may form a shallow trench having a second depth from the upper surface of the silicon wafer, as described above. In some implementations, the second depth is less than the first depth.

As further shown in FIG. 7, process 700 may include depositing a second insulating material within the shallow trench (block 740). For example, the one or more semiconductor processing tools may deposit a second insulating material within the shallow trench, as described above.

As further shown in FIG. 7, process 700 may include performing a single chemical-mechanical polishing process for the deep trench and the shallow trench (block 750). For example, the one or more semiconductor processing tools may perform a single chemical-mechanical polishing process for the deep trench and the shallow trench, as described above.

Process 700 may include additional implementations, such as any single implementation or any combination of implementations described below and/or in connection with one or more other processes described elsewhere herein.

In a first implementation, process 700 includes depositing, after depositing the second insulating material within the shallow trench, material for semiconductor device operation within an active area of the silicon wafer.

In a second implementation, alone or in combination with the first implementation, process 700 includes applying, before depositing material for semiconductor device operation within the active area of the silicon wafer, anneal to the silicon wafer.

In a third implementation, alone or in combination with one or more of the first and second implementations, the second insulating material surrounds the active area of the silicon wafer.

In a fourth implementation, alone or in combination with one or more of the first through third implementations, the second insulating material comprises an oxide layer.

In a fifth implementation, alone or in combination with one or more of the first through fourth implementations, process 700 includes depositing, before performing the single chemical-mechanical polishing process for the deep trench and the shallow trench, material for semiconductor device operation within an active area of the silicon wafer.

Although FIG. 7 shows example blocks of process 700, in some implementations, process 700 may include additional blocks, fewer blocks, different blocks, or differently arranged blocks than those depicted in FIG. 7. Additionally, or alternatively, two or more of the blocks of process 700 may be performed in parallel.

Figure 8:
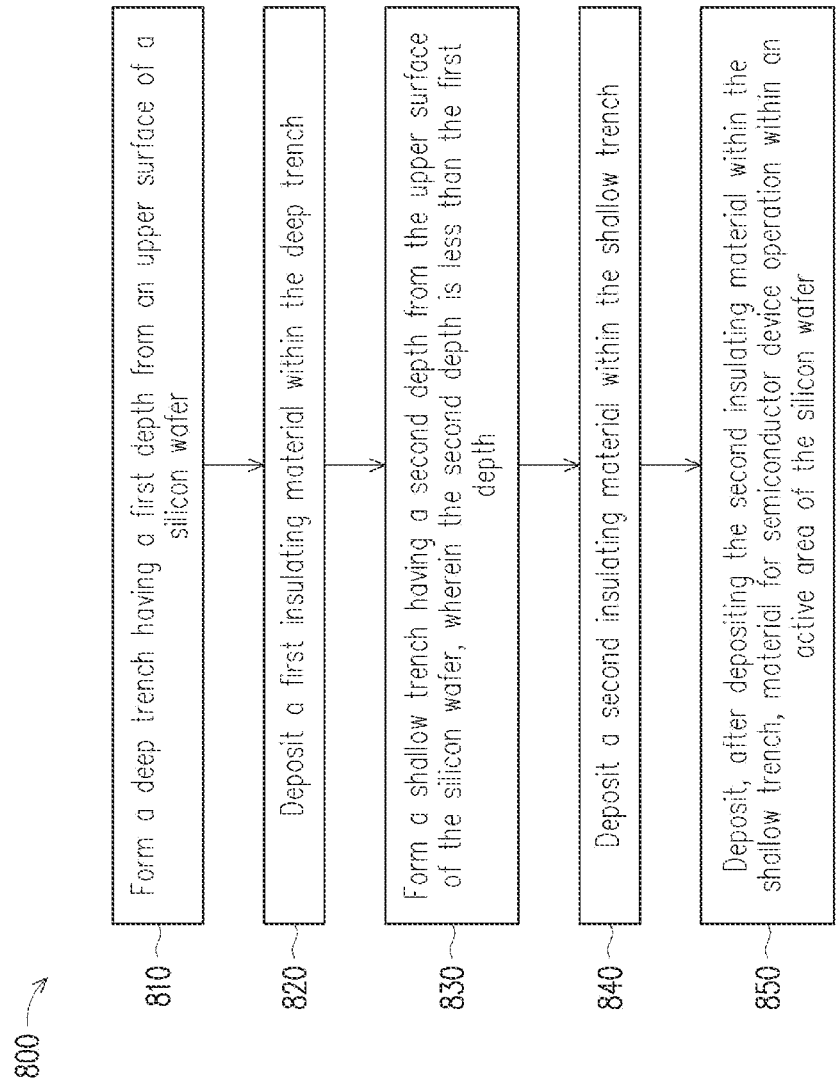

FIG. 8 is a flowchart of an example process 800 associated with a trench isolation process. In some implementations, one or more process blocks of FIG. 8 may be performed by one or more semiconductor processing tools (e.g., deposition tool 102, etching tool 104, CMP tool 106, and/or wafer/die transport device 108). Additionally, or alternatively, one or more process blocks of FIG. 8 may be performed by one or more components of device 500, such as processor 520, memory 530, storage component 540, input component 550, output component 560, and/or communication interface 570.

As shown in FIG. 8, process 800 may include forming a deep trench having a first depth from an upper surface of a silicon wafer (block 810). For example, the one or more semiconductor processing tools may form a deep trench having a first depth from an upper surface of a silicon wafer, as described above.

As further shown in FIG. 8, process 800 may include depositing a first insulating material within the deep trench (block 820). For example, the one or more semiconductor processing tools may deposit a first insulating material within the deep trench, as described above.

As further shown in FIG. 8, process 800 may include forming a shallow trench having a second depth from the upper surface of the silicon wafer, wherein the second depth is less than the first depth (block 830). For example, the one or more semiconductor processing tools may form a shallow trench having a second depth from the upper surface of the silicon wafer, as described above. In some implementations, the second depth is less than the first depth.

As further shown in FIG. 8, process 800 may include depositing a second insulating material within the shallow trench (block 840). For example, the one or more semiconductor processing tools may deposit a second insulating material within the shallow trench, as described above.

As further shown in FIG. 8, process 800 may include depositing, after depositing the second insulating material within the shallow trench, material for semiconductor device operation within an active area of the silicon wafer (block 850). For example, the one or more semiconductor processing tools may deposit, after depositing the second insulating material within the shallow trench, material for semiconductor device operation within an active area of the silicon wafer, as described above.

Process 800 may include additional implementations, such as any single implementation or any combination of implementations described below and/or in connection with one or more other processes described elsewhere herein.

In a first implementation, a portion of the second insulating material above an upper surface of the first insulating material is recessed from a portion of the second insulating material that is laterally displaced from the first insulating material by an amount in a range from approximately 500 angstroms to approximately 2,500 angstroms.

In a second implementation, alone or in combination with the first implementation, a thickness of the second insulating material on an upper surface of the first insulating material is an amount in a range from approximately 2,000 angstroms to approximately 4,000 angstroms.

In a third implementation, alone or in combination with one or more of the first and second implementations, the shallow trench has a width that is greater than a width of the deep trench, wherein the shallow trench extends laterally from one or more lateral ends of the deep trench.

In a fourth implementation, alone or in combination with one or more of the first through third implementations, a thickness of a first portion of the second insulating material that is laterally displaced from the deep trench (e.g., the first insulating material) is less than a thickness of a second portion of the second insulating material that is above the first insulating material (e.g., above the upper surface of the deep trench).

In a fifth implementation, alone or in combination with one or more of the first through fourth implementations, the thickness of the first portion of the second insulating material that is laterally displaced from the deep trench is less than the thickness of the second portion of the second insulating material that is above the first insulating material by an amount in a range from approximately 0 angstroms to approximately 500 angstroms.

In a sixth implementation, alone or in combination with one or more of the first through fifth implementations, a corner roughness between a first portion of the second insulating material that is laterally displaced from the deep trench (e.g., an upper surface of the deep trench) and a second portion of the second insulating material that is above the first insulating material (e.g., above the upper surface of the deep trench) is an amount in a range from approximately 0 angstroms to approximately 200 angstroms.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

Based on forming the deep trench before the shallow trench, an upper surface of the deep trench may be sealed by an oxidation layer that fills the shallow trench. The oxidation layer may reduce defects on the upper surface of the deep trench. Additionally, based on performing a single CMP process for both the deep trench and the shallow trench, manufacturing costs may be reduced by eliminating a step of a manufacturing process. Further, based on forming the deep trench and the shallow trench before forming an active area of the silicon wafer, one or more semiconductor processing tools may apply anneal to repair damage that is incurred during a trench isolation process. Still further, cycle time for manufacturing semiconductor chips using silicon wafers may be improved based on preparing the silicon wafers with the DTI before starting a processes of manufacturing the semiconductor chips.

As described in greater detail above, some implementations described herein provide one or more methods of providing trench isolation.

In some implementations, a method of providing trench isolation includes forming a deep trench within a silicon wafer and depositing a first insulating material within the deep trench. The method further includes forming, after forming the deep trench with the silicon wafer, a shallow trench above the deep trench and depositing a second insulating material within the shallow trench.

In some implementations, a method of providing trench isolation includes forming a deep trench having a first depth from an upper surface of a silicon wafer and depositing a first insulating material within the deep trench. The method further includes forming a shallow trench having a second depth from the upper surface of the silicon wafer, wherein the second depth is less than the first depth, and depositing a second insulating material within the shallow trench. The method further includes performing a single CMP process for the deep trench and the shallow trench.

In some implementations, a method of providing trench isolation includes forming a deep trench having a first depth from an upper surface of a silicon wafer and depositing a first insulating material within the deep trench. The method further includes forming a shallow trench having a second depth from the upper surface of the silicon wafer, wherein the second depth is less than the first depth, and depositing a second insulating material within the shallow trench. The method further includes depositing, after depositing the second insulating material within the shallow trench, material for semiconductor device operation within an active area of the silicon wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of providing trench isolation, comprising:
performing a deep trench isolation process for a silicon wafer;
forming, after performing the deep trench isolation process, a shallow trench having a lower surface that is above a lower surface of a deep trench associated with the deep trench isolation process,
wherein an entirety of a first portion of the lower surface of the shallow trench resides below an entirety of a second portion of the lower surface of the shallow trench and is co-planar with a top surface of an entirety of the deep trench; and
depositing an insulating material within the shallow trench,
wherein a thickness of a first portion of the insulating material that is laterally displaced from the deep trench is greater than a thickness of a second portion of the insulating material that is above the deep trench.

2. The method of claim 1, further comprising:
polishing the deep trench and the shallow trench in a same chemical-mechanical polishing process.

3. The method of claim 1, further comprising:
forming an active area of the silicon wafer based on forming the shallow trench after performing the deep trench isolation process.

4. The method of claim 1, further comprising:
annealing the silicon wafer based on forming the shallow trench after performing the deep trench isolation process.

5. The method of claim 1, further comprising:
sealing an upper surface of the deep trench with an oxidation layer based on forming the shallow trench after performing the deep trench isolation process.

6. The method of claim 1, wherein performing the deep trench isolation process comprises:
depositing a liner and an insulating material within the deep trench.

7. The method of claim 1, wherein performing the deep trench isolation process comprises:
depositing an insulating material within the deep trench.

8. A method of providing trench isolation, comprising:
performing a deep trench isolation process to form a deep trench having a first depth from an upper surface of a silicon wafer;
forming, after performing the deep trench isolation process, a shallow trench having a second depth, from the upper surface of the silicon wafer, that is less than the first depth,
wherein the shallow trench has a lower surface comprising a first portion, that is co-planar with an entirety of the deep trench, and a second portion that is on a different plane than the first portion;
depositing an insulating material within the shallow trench; and
performing a chemical-mechanical polishing process for the deep trench and the shallow trench,
wherein a thickness of a first portion of the insulating material that is laterally displaced from the deep trench is greater than a thickness of a second portion of the insulating material that is above the deep trench after performing the chemical-mechanical polishing process, wherein a top surface of the first portion of the insulating material is co-planar with a top surface of the silicon wafer.

9. The method of claim 8, wherein performing the chemical-mechanical polishing process comprises:
removing a portion of the insulating material.

10. The method of claim 8, further comprising:
forming an active area of the silicon wafer based on performing the chemical-mechanical polishing process.

11. The method of claim 10, further comprising:
annealing the silicon wafer based on forming the active area.

12. The method of claim 8, wherein performing the deep trench isolation process comprises:
depositing a photoresist layer outside of a region associated with the deep trench; and
etching one or more layers within the region associated with the deep trench.

13. The method of claim 12, wherein performing the deep trench isolation process further comprises:
etching into the silicon wafer; and
removing the photoresist layer.

14. A system, comprising:
one or more tools configured to:
perform a deep trench isolation process for a silicon wafer;
form, after a deep trench is formed via the deep trench isolation process, a shallow trench having a lower surface that is above a lower surface of the deep trench; and
deposit an insulating material within the shallow trench,
wherein a thickness of a first portion of the insulating material that is laterally displaced from the deep trench is greater than a thickness of a second portion of the insulating material that is above the deep trench,
wherein at least one of:
a top surface of the first portion of the insulating material is co-planar with a top surface of the silicon wafer, or
an entirety of a first portion of the lower surface of the shallow trench resides below an entirety of a second portion of the lower surface of the shallow trench and is coplanar with a top surface of an entirety of the deep trench.

15. The system of claim 14, wherein the one or more tools are further configured to:
   polish the deep trench and the shallow trench in a same chemical-mechanical polishing process.

16. The system of claim 14, wherein the one or more tools are further configured to:
   form an active area of the silicon wafer based on the shallow trench being formed after the deep trench isolation process.

17. The system of claim 14, wherein the one or more tools are further configured to:
   anneal the silicon wafer based on the shallow trench being formed after the deep trench isolation process.

18. The system of claim 14, wherein the one or more tools are further configured to:
   seal an upper surface of the deep trench with an oxidation layer based on the shallow trench being formed after the deep trench isolation process.

19. The system of claim 14, wherein the one or more tools, to perform the deep trench isolation process, are configured to:
   deposit a liner and an insulating material within the deep trench.

20. The system of claim 14, wherein the one or more tools, to perform the deep trench isolation process, are configured to:
   deposit an insulating material within the deep trench.

\* \* \* \* \*